(12) United States Patent
Adam et al.

(10) Patent No.: US 12,082,368 B2
(45) Date of Patent: Sep. 3, 2024

(54) COOLING DEVICE AND METHOD OF MANUFACTURING THE SAME

(71) Applicant: Aptiv Technologies AG, Schaffhausen (CH)

(72) Inventors: Frank H. Adam, Dublin (IE); Klaus Kaufmann, Dublin (IE); Tobias Merten, Dublin (IE)

(73) Assignee: Aptiv Technologies AG, Schaffhausen (CH)

( * ) Notice: Subject to any disclaimer, the term of this patent is extended or adjusted under 35 U.S.C. 154(b) by 252 days.

(21) Appl. No.: 17/646,614

(22) Filed: Dec. 30, 2021

(65) Prior Publication Data

US 2022/0217868 A1    Jul. 7, 2022

(30) Foreign Application Priority Data

Jan. 4, 2021 (EP) .................................... 21150125
Oct. 29, 2021 (EP) .................................... 21205717

(51) Int. Cl.
*H05K 7/20* (2006.01)
*H05K 1/02* (2006.01)

(52) U.S. Cl.
CPC ....... *H05K 7/20254* (2013.01); *H05K 1/0203* (2013.01)

(58) Field of Classification Search
CPC ........ H05K 7/20; H05K 1/02; H05K 7/20254; H05K 1/0203; H05K 7/20872; H05K 1/0201; H05K 1/0204
USPC ............................ 361/679.44, 679.5, 679.53
See application file for complete search history.

(56) References Cited

U.S. PATENT DOCUMENTS

| 4,791,983 | A | * | 12/1988 | Nicol | ................... | H01L 23/473 |
| | | | | | | 257/E23.098 |
| 4,809,134 | A | * | 2/1989 | Tustaniwskyj | ...... | H01L 23/4332 |
| | | | | | | 257/E23.091 |
| 5,001,548 | A | | 3/1991 | Iversen | | |

(Continued)

FOREIGN PATENT DOCUMENTS

| DE | 2614917 | 10/1976 |
| EP | 1020910 | 7/2000 |

(Continued)

OTHER PUBLICATIONS

"Extended European Search Report", EP Application No. 20190978. 5, Jan. 20, 2021, 8 pages.

(Continued)

*Primary Examiner* — Danny Nguyen
(74) *Attorney, Agent, or Firm* — Harness, Dickey & Pierce, P.L.C.

(57) ABSTRACT

An apparatus or system can act as a cooling device configured for cooling a plurality of high-power electronic components mounted on a circuit board. The apparatus includes a plurality of cooling plate assemblies, the cooling plate assemblies each including a cooling plate for mating to one of the high-power electronic components and an enclosure mounted to the cooling plate for defining a coolant transport path over at least part of a surface thereof. The apparatus further includes one or more flexible conduits that connect between the cooling plate assemblies for fluid communication between their respective coolant transport paths.

19 Claims, 4 Drawing Sheets

(56) References Cited

U.S. PATENT DOCUMENTS

| | | | |
|---|---|---|---|
| 5,465,192 A * | 11/1995 | Yoshikawa | H01L 23/433 257/E23.09 |
| 6,111,749 A | 8/2000 | Lamb et al. | |
| 6,364,009 B1 | 4/2002 | MacManus et al. | |
| 8,432,691 B2 | 4/2013 | Toftloekke et al. | |
| 9,036,353 B2 | 5/2015 | Buckman et al. | |
| 9,694,451 B1 | 7/2017 | Ross | |
| 9,907,216 B2 | 2/2018 | Park | |
| 10,448,545 B2 | 10/2019 | Lim et al. | |
| 10,575,438 B1 * | 2/2020 | Yatskov | H01L 23/473 |
| 10,631,438 B2 | 4/2020 | Coteus et al. | |
| 2005/0128705 A1 | 6/2005 | Chu et al. | |
| 2005/0212121 A1 * | 9/2005 | Ravi | H01L 23/473 257/E23.098 |
| 2005/0241799 A1 | 11/2005 | Malone et al. | |
| 2006/0227504 A1 | 10/2006 | Chen et al. | |
| 2007/0076374 A1 * | 4/2007 | Mongia | H01L 23/473 257/E23.098 |
| 2007/0177356 A1 | 8/2007 | Panek | |
| 2008/0296256 A1 | 12/2008 | Panek | |
| 2009/0213541 A1 | 8/2009 | Butterbaugh et al. | |
| 2012/0063098 A1 | 3/2012 | Paquette et al. | |
| 2012/0103576 A1 | 5/2012 | Toftloekke et al. | |
| 2013/0343005 A1 | 12/2013 | David et al. | |
| 2014/0146475 A1 | 5/2014 | Buckman et al. | |
| 2014/0233175 A1 | 8/2014 | Demange et al. | |
| 2014/0246174 A1 * | 9/2014 | Arvelo | B23P 15/26 165/104.11 |
| 2016/0290728 A1 | 10/2016 | Coteus et al. | |
| 2016/0291652 A1 | 10/2016 | Rossi et al. | |
| 2017/0082222 A1 | 3/2017 | Buvid et al. | |
| 2019/0204023 A1 | 7/2019 | Takken et al. | |
| 2019/0259632 A1 | 8/2019 | Isaacs et al. | |
| 2020/0024763 A1 | 1/2020 | Dan et al. | |
| 2020/0232688 A1 | 7/2020 | Ganter et al. | |
| 2020/0337181 A1 | 10/2020 | Tian et al. | |
| 2021/0392780 A1 | 12/2021 | Adam et al. | |

FOREIGN PATENT DOCUMENTS

| | | |
|---|---|---|
| EP | 3037771 | 6/2016 |
| EP | 3923689 A1 | 12/2021 |
| EP | 3955716 A1 | 2/2022 |
| GB | 2310321 | 8/1997 |
| GB | 2584991 | 12/2020 |
| WO | 2010077237 | 7/2010 |
| WO | 2020035172 | 2/2020 |
| WO | 2020234600 | 11/2020 |

OTHER PUBLICATIONS

"Extended European Search Report", EP Application No. 21150125.9, May 31, 2021, 16 pages.

"Extended European Search Report", EP Application No. 20179751.1, Nov. 18, 2020, 12 pages.

"Extended European Search Report", EP Application No. 21205717.8, Apr. 4, 2022, 33 pages.

* cited by examiner

COOLING DEVICE AND METHOD OF MANUFACTURING THE SAME

CROSS-REFERENCE TO RELATED APPLICATIONS

This application claims priority to European Patent Application Number 21205717.8, filed Oct. 29, 2021, which in turns claims priority to European Patent Application Number 21150125.9, filed Jan. 4, 2021, the disclosures of which are hereby incorporated by reference in their entirety herein.

BACKGROUND

Some electronic components get hot during use, which can subsequently compromise their function or lead to component damage. As such, it is common to fit cooling devices to electronic circuitry to maintain their operating temperature within an acceptable tolerance. For particularly high demand applications, liquid cooling systems are often used due to their high cooling efficiency. Conventional liquid cooling systems often have a cold plate, which is a device typically having a flat metal body with an internal circuit of cooling channels or tubes through which coolant fluid may be circulated. In use, the cold plate is fitted against the electronic components and, as components get hot, heat is transferred through the body and cooling tubes into the coolant, from where it is transported away from the circuit.

Although some electronic components on a printed circuit board (PCB) can become very hot in use, other components do not. For example, high-power electronic components, such as System-on-a-Chip (SoCs), generate large amounts of waste heat when operating and hence it is critical to the operation of the device to efficiently cool these hot components. Conversely, other components may be low-power components, which require cooling, but generate less waste heat and hence have lower heat transfer demands. There can often also be other components which are passive, such as diodes and capacitors, which do not require active cooling at all. At the same time, the passive components are typically geometrically higher (i.e., taller) than adjacent high-power and low-power components. Therefore, when a flat cold plate is fitted over a PCB, it is common for the plate to abut the tops of the taller, passive components, but leave a gap between the plate and the tops of the shorter, high-power and low-power components. As these air gaps may otherwise provide a barrier to heat transfer from the very components the cold plate is intended to cool, it is therefore necessary to fit so-called "pedestals" in these gaps. These pedestals are typically formed of the same metal as the body of the cold plate, such as aluminum, and provide a column of thermally conductive material for establishing a thermal path from the high or low power component through to the cold plate.

An issue with the above conventional arrangements is that, despite the thermal conductivity of the pedestal material, the length of the thermal path means that pedestals nevertheless present a significant thermal resistance. For the high-power components in particular, the pedestals therefore provide a sub-optimal thermal connection between the component and the coolant.

The above issue is further exacerbated by the challenge of ensuring good thermal contact between a pedestal and a high-power component. In particular, air gaps between the opposing faces of the component and the pedestal can significantly reduce thermal conduction. These gaps may be anything from very tiny holes due to surface roughness, up to larger gaps caused by production variations compromising the dimensional stability of the assembly. For example, in practice, a printed circuit board (PCB) is not perfectly flat, leading to some components being mounted further from the cold plate than others. At the same time, the components themselves may have dimensional variations or be mounted to the PCB in a slightly tilted configuration, which also leads to variations in the distance to the cold plate. To attempt to mitigate this, it is common to apply a layer of Thermal Interface Material (TIM) to fill these gaps and thereby improve the mating at the junction between the parts. However, as larger gaps can occur, it is typical to apply a relatively thick layer of TIM to ensure there is sufficient material to fill the gaps in their entirety. This unfortunately compromises the overall thermal conductivity because, although TIM is a better thermal conductor than air, it is not as effective as providing a very close connection between the high-power component and the cooling structures.

Additionally, the contact force between pedestals and components is hard to control in conventional arrangements. As such, this further contributes to the thermal resistance during heat exchange.

There therefore remains a need for an improved cooling device for cooling components mounted to a circuit board.

SUMMARY

The present disclosure relates to apparatus, systems, and cooling devices for cooling a plurality of electronic components mounted on a circuit board, and a method of manufacturing the same. The present disclosure is particularly relevant to cold plates for cooling electronic control units for automotive applications and most particularly to multi domain controllers (MDCs). The cooling device may be a cold plate for use with an electronic control unit or multi domain controller.

According to a first aspect, there is provided a cooling device for cooling a plurality of high-power electronic components mounted on a circuit board, the device including: a plurality of cooling plate assemblies, each including a cooling plate for mating to one of the high-power electronic components and an enclosure mounted to the cooling plate for defining a coolant transport path over at least part of a surface thereof; and one or more conduits connecting between the cooling plate assemblies for fluid communication between their respective coolant transport paths, wherein the conduits are flexible such that the relative positions of the cooling plates are adjustable for mating to respective high-power electronic components in different planes; and wherein the cooling plates are formed of sheet metal and each cooling plate includes a mating face for mating flat against a top surface of its respective high-power electronic component.

In this way, cooling may be targeted to the primary heat sources on a circuit board. That is, by allowing the relative positions of each cooling plate to be independently adjusted for its respective high-power component, the surface area of the top of each high-power component in mating contact with the opposing surface of the cooling plate may be maximized. This thereby ensures optimized heat transfer away from the component surfaces into the cooling plate. At the same time, the enclosures provide a coolant fluid pathway which is located very close to the high-power components, with the relatively thin, substantially planar configuration of the sheet metal cooling plate providing a short thermal path between these components and the coolant fluid being circulated therein. Accordingly, a high cooling efficiency may be achieved, with a simple and light construction.

In embodiments, the cooling plates are formed of pressed sheet metal. This provides for a low weight, cost effective construction. In alternative embodiments, the cooling plates are formed from dye cast sheets.

The mating face includes component formations for mating to the top surfaces of one or more other electronic components. In this way, the mating face may be three dimensionally shaped for mating against components of different heights. As such, relatively taller or shorter components can be accommodated and cooled by the same cooling plate. For example, the mating face may be shaped to have projected regions for mating with shorter components and recessed regions for mating with taller components. Importantly, this is achieved with a simple and light sheet metal construction. In embodiments, the component formations are formed by pressing. In other embodiments, the component formations are formed by dye cast formations.

In embodiments, each cooling plate is configured to overlay one or more other electronic components mounted on the circuit board. In this way, the planar position of each cooling plate may be optimized for a respective high-power component, whilst the cooling plate may nevertheless also sit above and transfer heat away from other components. For example, the cooling plate may be configured to also overlay one or more other low-power components for actively cooling these components. Such low-power components may have lower cooling demand than adjacent high-power components and therefore are more tolerant of a less optimized thermal contact. Consequently, a greater distance between low-power components and the cooling plate may be provided for in the shaping of the cooling plate where this is required to optimize contact with the high-power components. This allows, for example, for the accommodation of tilting in the mounting high-power components, because the cooling plate may be similarly tilted without engaging the low-power components. Thermal interface material may be provided for filling the gaps between the other components and the cooling plate in such instances. Although this represents a higher thermal resistance, this is still acceptable for low-power components.

In embodiments, at least one of the plurality of cooling plate assemblies includes a second cooling plate and wherein the enclosure is mounted to both the cooling plate and the second cooling plate. In this way, the enclosure may be provided as a fluid conduit bridging across two adjacent cooling plates. As such, a cooling plate and a neighboring cooling plate may be connected by a common enclosure. This removes the need for separate enclosures and or a flexible conduit to connect them, and hence a lower number of components and less material is required to achieve effective cooling. In embodiments, the enclosure is provided as a flexible profile, such as an aluminum flexible profile.

In embodiments, the enclosure mounted to both the cooling plate and the second cooling plate is formed as a flattened fluid conduit for longitudinal flexibility such that the relative positions of the cooling plate and second cooling plate are adjustable for mating to respective high-power electronic components in different planes. In this way, the shape of the enclosure structure, such as a thin rectangular prism shape, in combination with the thinness of the enclosure material, allows the enclosure to flex along its length. Consequently, differences in height may be accommodated by cooling plates mounted to different ends of the enclosure.

In embodiments, the enclosures are formed of sheet metal, such as folded planar sheets or extruded thin walled structures. For example, in embodiments the enclosures may be formed by extruded flexible profiles, such as flexible extruded aluminum profiles. These thereby provide an inexpensive and thermally efficient structure.

In embodiments, the enclosures are fixed to the cooling plates by at least one of brazing, soldering, welding, or gluing. Other joining process are also possible.

In embodiments, one or more conduits have a maximum bend radius of less than 45 mm. In this way, a flexible construction is provided which maintains fluid flow without kinking.

In embodiments, the one or more conduits include one of an elastomer tube or a flexible (e.g., corrugated) metal tube such as a metallic bellow. In this way, the relative positions of the cooling plates may be easily adjusted.

In embodiments, the cooling device further includes a plurality of couplings for biasing the cooling plates toward the circuit board for mating to the high-power electronic components. In this way, a localized compressive pressure may be applied to the cooling plate at a number of different locations over its footprint. For example, the couplings may be distributed to provide a consistent compressive pressure around each high-power component. This may also maintain the mating between the cooling plates and the high-power components throughout different operating conditions, thereby providing improved cooling consistency. At the same time, the volume of thermal interface material required to maintain an effective thermal contact is minimized.

In embodiments, the couplings include a fixture for connection to the circuit board and a spring coupled to the fixture for applying a biasing force to the respective cooling plate. In this way, the springs may allow a consistent compressive pressure to be applied and maintained. Furthermore, by securing the cooling plate directly to the circuit board, a compact assembly may be provided.

In embodiments, the cooling device further comprises a biasing means for biasing the circuit board toward the cooling plate. In this way, mating between the cooling plate and the components on the circuit board may be facilitated without necessitating further attachment holes in the circuit board.

In embodiments, the cooling plates have a footprint shaped for exposing one or more other electronic components mounted to the circuit board when the respective cooling plate is mated to its high-power electronic component. In this way, the cooling plates may sit below taller passive components and thereby reduce the distance of the thermal path from shorter, high-power components.

In embodiments, the enclosure of each cooling plate assembly includes a shaped sheet fixed to an upper face of the cooling plate to define a fluid cavity for forming the coolant transport path therebetween. This allows for simplified manufacturing in which each enclosure may be formed, for example, by pressing or bending sheet metal to define the cavities which make up the coolant transport circuit. Furthermore, the enclosure may then be brazed, welded, soldered, or glued to the contact sheet to provide a fluid tight mounting for the coolant transport circuit.

In embodiments, the shaped metal sheet defines one or more substantially cuboidal or rectangular prism shaped fluid transport cavities.

In other embodiments, the shaped sheet is formed of an elastomer. In this way, a lightweight construction may be provided. In embodiments, the elastomeric structures may be produced by any one of compression molding, injection molding or pressure thermoforming.

In embodiments, the elastomer shaped sheet is formed integrally with the one or more conduits. In this way, a continuous body may be provided to define both the enclosures and the connecting conduits. This may mitigate the risks of coolant leakage between sections and simplify manufacture and assembly.

In embodiments, the cooling device further comprises elastic elements for securing the cooling device to the circuit board. In this way, good thermal contact between the cooling plates and the high-power electronic components may be maintained.

In embodiments, the enclosures have a flattened configuration. In this way, the coolant is able to spread over a large area of the upper face of each cooling plate, thereby improving the efficiency at which heat is drawn from it.

In embodiments, the coolant transport path of each cooling plate assembly is defined by the space between the enclosure and the cooling plate. In this way, coolant may flow directly over an upper surface of the cooling plate, thereby minimizing the length of the thermal path between the coolant and the high-power components.

As discussed above, as the cooling plates are formed of sheet metal, a flat piece of metal may be simply bent or pressed into the required shape. At the same time, the metal may provide a high level of thermal conduction, and the thin construction minimizes the volume and weight of material required. In embodiments, the cooling plates are 2 mm to 3 mm thick. This may provide for the effective transport of the heat from the hot components. In embodiments the cooling plates are formed by dye casting into the required shape. This construction is still quite flat, minimizing the mass of material.

In embodiments, the enclosure may contain additional metal structures (e.g., fins) providing an increased cooling surface in contact to the coolant.

According to a second aspect, there is provided a method of manufacturing a cooling device for cooling a plurality of high-power electronic components mounted on a circuit board, the method including the steps of: shaping a plurality of cooling plates to each mate to one of the plurality of high-power electronic components; mounting enclosures to each of the cooling plates for forming cooling plate assemblies, wherein a coolant transport path is defined between each enclosure and at least part of a surface of its respective cooling plate; and connecting one or more conduits between the cooling plate assemblies for fluid communication between their respective coolant transport paths, wherein the conduits are flexible such that the relative positions of the cooling plates are adjustable for mating to respective high-power electronic components in different planes, and wherein the cooling plates are formed of sheet metal to comprise a mating face for mating flat against a top surface of its respective high-power electronic component. In this way, a simple manufacturing method is provided for the forming a highly efficient and lightweight cooling device.

In embodiments, the step of shaping the plurality of cooling plates further includes pressing component formations into the mating face for mating to the top surfaces of one or more other electronic components. In other embodiments, the step of shaping the plurality of cooling plates further includes dye casting component formations into the mating face for mating to the top surfaces of one or more other electronic components.

According to a third aspect, there is provided a cooling device for cooling a plurality of high-power electronic components mounted on a circuit board, the device including: first and second cooling plates each comprising a mating face for mating flat against a top surface of one of the high-power electronic components; and a flattened fluid conduit mounted to the first and second cooling plates for defining a coolant transport path; wherein the flattened fluid conduit is formed of sheet metal having a thickness for allowing longitudinal flexibility of the flattened fluid conduit such that the relative positions of the first and second cooling plates are adjustable for mating to respective high-power electronic components in different planes. In embodiments, the first and second cooling plates are formed of sheet metal. In embodiments, the flattened fluid conduit is formed as an extruded sheet metal structure, such as a flexible profile.

According to a fourth aspect, there is provided use of a cooling device for cooling a plurality of high-power electronic components mounted on a circuit board, including: providing a plurality of cooling plate assemblies connected by one or more flexible conduits, wherein each cooling plate assembly includes a cooling plate and an enclosure mounted to the cooling plate for defining a coolant transport path over at least part of a surface thereof, wherein the conduits provide fluid communication between the coolant transport paths; and mating each cooling plate to one of the plurality of high-power electronic components, wherein the relative positions of the cooling plates are adjusted for mating to their respective high-power electronic components in different planes; and wherein the cooling plates are formed of sheet metal and each cooling plate includes a mating face for mating flat against a top surface of its respective high-power electronic component.

In embodiments, each cooling plate is configured to mate with one or more other electronic components mounted on the circuit board, and wherein the use of the cooling device further includes applying a first layer of TIM having a first thickness to each of the plurality of high-power electronic components, and applying a second layer of TIM having a second thickness to one or more of the other electronic components. In embodiments, the second thickness is greater than the first thickness.

BRIEF DESCRIPTION OF THE DRAWINGS

Illustrative embodiments are now described with reference to the accompanying drawings in which.

DETAILED DESCRIPTION

Figure 1:
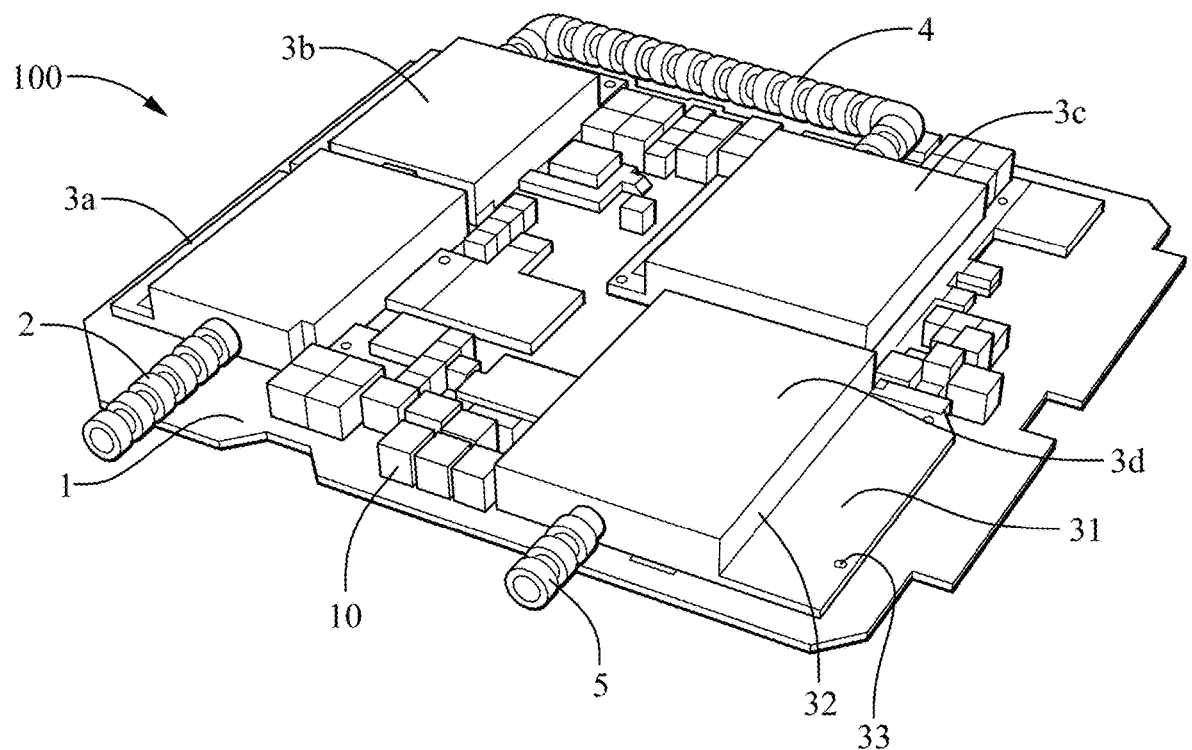
FIG. 1 shows an isometric view of a cooling device according to a first embodiment mounted to a circuit board.

FIG. 1 shows a first embodiment of a cooling device 100 mounted to a circuit board 1. The cooling device 100 includes a plurality of cooling plate assemblies 3, which are each associated with a high-power component provided on the circuit board. In this embodiment, four cooling plate assemblies 3a-d are provided corresponding to the four high-power components provided on this circuit board 1, as is described in further detail below.

Each cooling plate assembly 3 includes a cooling plate 31 and an enclosure 32 mounted thereto. The cooling plate 31 is formed of a sheet metal material, such as aluminum, and is shaped so that its footprint keys between the taller passive components 10 provided on the circuit board 1. As such, each cooling plate 31 may be seated closer to the circuit board 1, beneath the tops of the passive components 10 and overlaying the high-power and low-power components on the circuit board. The shaping of the cooling plates 31 may be achieved by various methods, for example by stamping, deep drawing, hydro forming, electron-beam cutting, and 3D-printing. The cooling plates 31 further includes coupling apertures 33 through which the cooling plate assembly may be secured to the circuit board 1, as is described in further detail below.

The enclosures 32 are formed of a shaped metal sheet and define a hollow cavity over a portion of the upper surface of each respective cooling plate 31. As such, the hollow cavities defined by each enclosure 32 forms a fluid transport path for coolant over the cooling plate 31.

The cooling plate assemblies 3 are connected by three conduits 4. Two shorter conduits 4 are provided between the first and second cooling plate assemblies (3a, 3b) and the third and fourth cooling plate assemblies (3c, 3d). A longer conduit 4 is provided between the second and third cooling plate assemblies (3a, 3b). The conduits 4 are connected into the enclosures 32 of each cooling plate assembly 3 through a port and thereby establish fluid communication between the enclosures 32. As such, the enclosures 32 and the conduits 4 form a coolant transport circuit through which coolant can be circulated. In use, coolant is fed into the circuit though inlet 2 (inlet pipe 2), which feeds the enclosure of the first cooling plate assembly 3a, and coolant is fed out from the enclosure of the fourth cooling plate assembly 3d through the outlet 5 (outlet pipe 5).

In this embodiment, the conduits 4 are formed of a flexible corrugated metal tube, having a bellow type construction. As such, the conduits 4 may bend whilst remaining securely connected to the ports of the respective enclosures 32 to which they are connected. Fluid communication between the enclosures 32 may thereby be maintained whilst allowing the cooling plate assemblies 3a-d to be moved and angled relative to one another, albeit that they are restrained by the length of each conduit 4. In this embodiment, the conduit 4 has a minimum bend radius of 25 mm, with this being the minimum inside radius at which the tube may be bent without kinking it. In this respect, it is to be understood that the required flexibility of the conduit 4 can vary depending on the size of the circuit and the required relative heights of the cooling plate assemblies 3a-d. That said, once the cooling plate assemblies 3a-d are fitted to the circuit board 1, the conduits 4 may be sufficiently flexible to not apply tension to the cooling plates 31, which can cause the plates 31 to pull or twist away from their engagement with the electronic components beneath.

Figure 2:
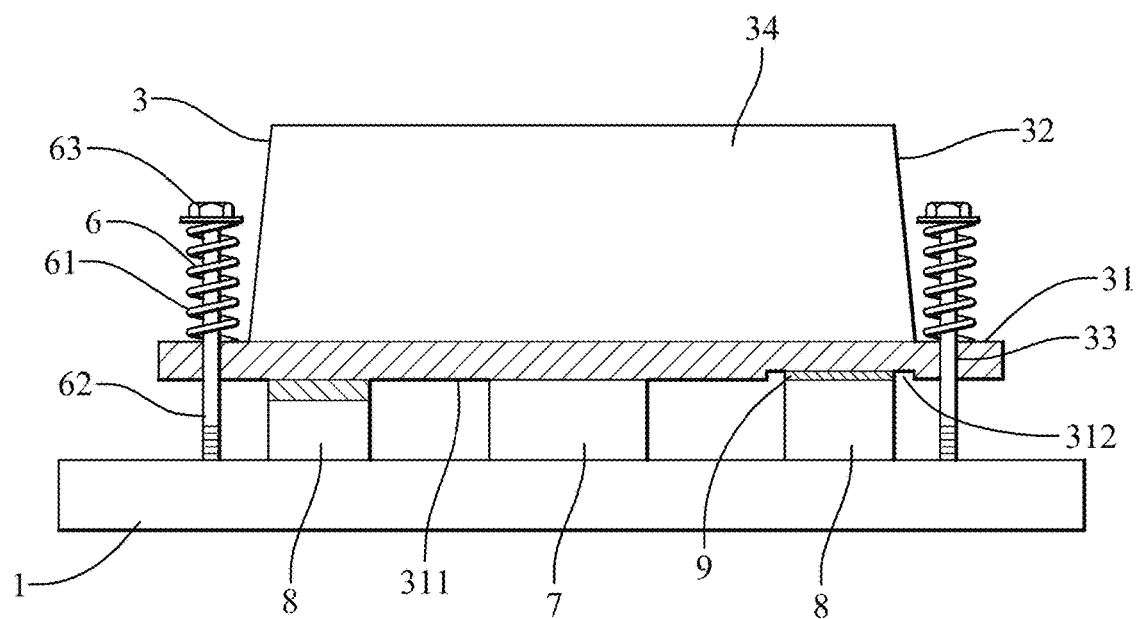
FIG. 2 shows a cross-sectional view through one of the cooling plate assemblies of the cooling device shown in FIG. 1.

In this connection, FIG. 2 shows a cross sectional view through one of the cooling plate assemblies 3 shown in FIG. 1. The cooling plate 31 is seated on top of a high-power component 7 and two lower-power components 8 mounted on the circuit board 1. The bottom surface of the cooling plate 31 provides a mating face 311 which sits flat on the top face of the high-power component 7. As such, the mating face 311 is positioned in effectively the same plane as the top face of the high-power component 7, with the two surfaces substantially abutting one another. That said, a thin layer of thermal interface material (TIM) may be provided between the surfaces to compensate for surface roughness. As such, this TIM layer 9 may be provided as a thermal grease which wets the surface asperities on the opposing faces of the high-power component 7 and the mating face 311 to provide optimal thermal coupling, whilst keeping the TIM layer as thin as possible to enhance heat transfer.

To further facilitate the mating between the mating face 311 and the high-power component 7, the mating face 311 further includes component recess 312 to accommodate low-power components 8 which are taller than the adjacent high-power component 7. In FIG. 2, the top face of the low-power component 8 on the right of the high-power component 7 is taller and hence is located within the component recess 312. This thereby allows the mating face 311 to abut the top of the high-power component 7. A thicker TIM layer 9 may be provided between the top face of the right-hand low-power component 8 and the opposing surface within the component recess 312 to compensate for any differences in alignment between these surfaces. That is, the plane of the mating face 311 is aligned with the top face of the high-power component 7 to optimize the thermal connection with this component. However, this means that this engagement plane may be different from the plane of the top face of the right-hand low-power component 8, and consequently, any angular differences may be compensated by the TIM layer 9. Although this requires the use of a thicker TIM layer 9, because of the lower cooling requirements of the low-power component 8, the overall cooling performance is not compromised.

In addition to the above, for low-power components 8 that are shorter than the high-power component 7, differences in higher and engagement angle may be compensated by a relatively thick layer of TIM, as shown for the low-power component 8 on the left of the high-power component 7 in FIG. 2. In other embodiments, pedestals or component projection formations may also be provided on the mating face 311 for establishing a thermal connection with shorter components. Again, because the low-power components 8 have a lower cooling requirement, the overall cooling performance is not compromised.

The coupling apertures 33 provided in the cooling plate 31 receive biasing fixtures 6, which are used to connect the cooling plate assemblies 3 to the circuit board 1. Each biasing fixture 6 includes a screw 62 and a compression spring 61 arranged coaxially with the screw 62. The compression spring 61 is compressed between the screw head 63 and the upper surface of the cooling plate 31. As such, the biasing fixtures apply an equal biasing force to the cooling plate 31 to force its mating face 311 into uniform contact with the high-power component 7. This application of a consistent compressive force allows mechanical stresses arising due to external vibrations, as well as different rates of thermal expansion between different components, to be accommodated. As such, a good thermal contact is maintained between the cooling plate 31 and the underlying high-power component 7 throughout different operating conditions. For example, contact can be maintained despite variations in the operating loads and the thermal expansion coefficients of different components. Furthermore, in automotive applications, contact can be maintained even when vibrations arise during driving. This may thereby compensate for any dimensional variations in the assembly which can otherwise result in larger air gaps between the contacting surfaces. As a result, the need for Thermal Interface Material (TIM) is limited to compensating for any residual gaps that may arise due to the surface roughness of the high-power component 7 and cooling plate 31. Therefore, only a very thin layer of TIM is required.

In other embodiments, alternative biasing members may be provided instead of or in addition to the screw and spring arrangement shown in FIG. 2. For example, a biasing force may be applied by springs or elastomeric pressure pieces mounted below, to the side or above the cooling plate 31. For instance, biasing members may be attached to a housing which is used to enclose the circuit board 1 and cooling device 100. In such an arrangement, a guiding structure may be provided to restrain lateral movement of each cooling plate assembly 3 relative to the circuit board 1, whilst the biasing force is applied through the housing to maintain thermal contact. In other arrangements, the cooling device 100 may be mounted to the circuit board 1 using precisely machined spacers, without applying a biasing force. However, low tolerance manufacturing may be required with such an arrangement in order to keep opposing surfaces as close as possible.

The enclosure 32 is mounted to the upper surface of cooling plate 31 and forms the interior cavity 34 which provides the fluid path for the coolant. In this embodiment, the enclosure 32 is formed of a three-dimensionally shaped metal sheet, which is connected directly to the upper surface of the cooling plate 31 by, for example, brazing, soldering, or welding. The coolant fluid path is thereby provided by the space between the two sheet metals. The sheet may be shaped, for example, by stamping, deep drawing, hydro forming and electron-beam cutting. In this embodiment, the enclosure 32 is defined by a number of substantially cuboid sections to simplify the shaping process. Other enclosure arrangements may also be used, as is described in further detail below.

Figure 3:
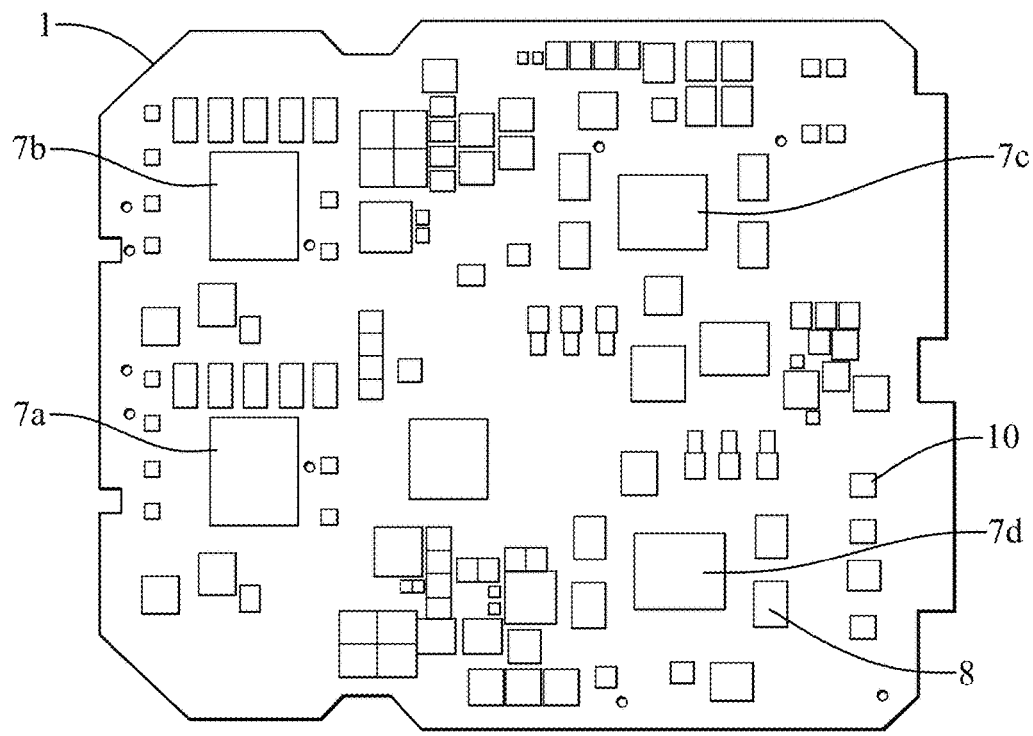
FIG. 3 shows a top view of an illustrative circuit board.

FIG. 3 shows a top view of an illustrative circuit board 1 onto which the cooling device 100 shown in FIG. 1 may be attached. The circuit board 1 is a printed circuit board including a plurality of components. It this example, the circuit board 1 includes four System-on-Chip components 7*a-d* which are critical high-power components that generate considerable waste heat during use. Surrounding these are a plurality of low-power components 8, which require cooling but generate less heat. There are also a large number of passive components 10 which do not require active cooling.

Figure 4:
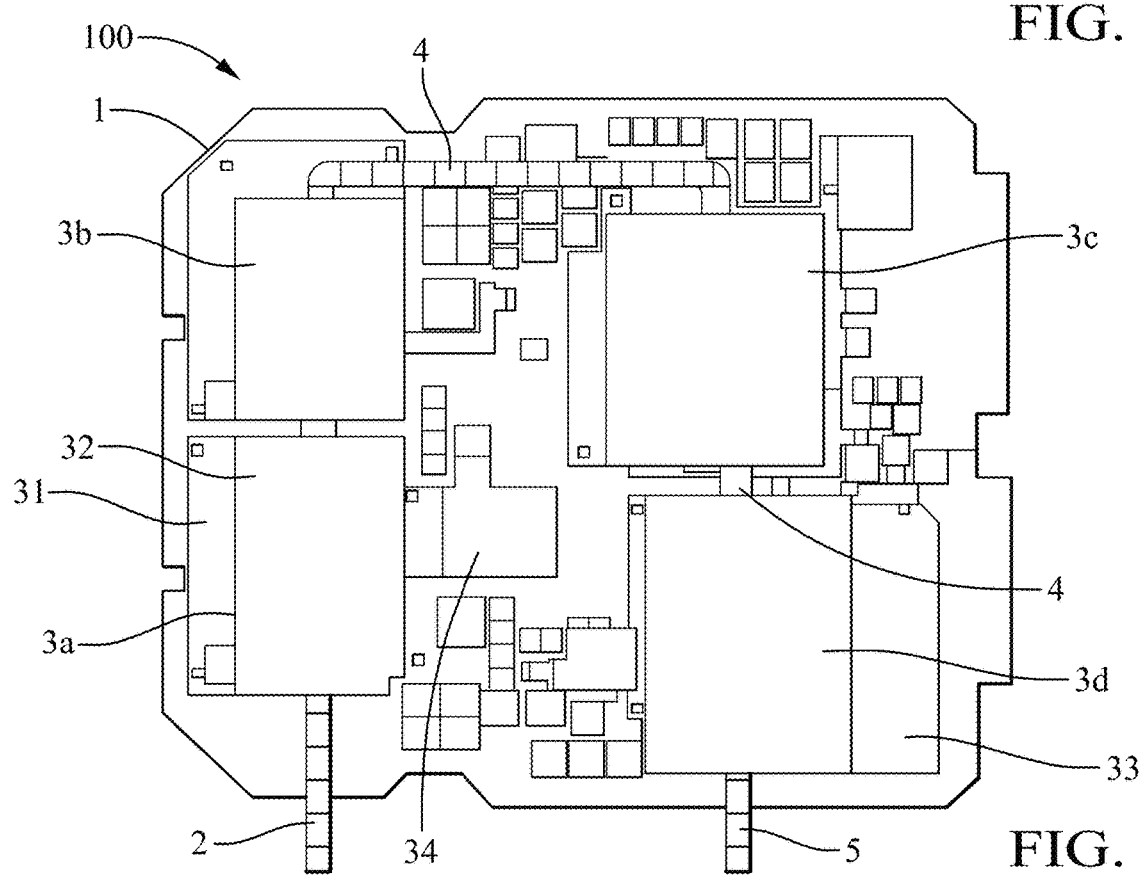
FIG. 4 shows a top view of the cooling device shown in FIG. 1 fitted to the circuit board shown in FIG. 3.

FIG. 4 shows the circuit board 1 of FIG. 1 once the cooling device 100 has been fitted. As shown, the four cooling plate assemblies 3*a-d* are aligned with individual ones of the high-power components 7*a-d*. Consequently, as described in relation to FIG. 2, each cooling plate assembly 3*a-d* is optimized for cooling its respective high-power component 7*a-d*. At the same time, the cooling plate assemblies 3*a-d* also cool the adjacent low-power components 8, whilst their footprints sit in the spaces between the taller passive components 10 (also see FIG. 1).

In instances where certain low-power components 8 are remote to the main cluster of components around a high-power component 7, the footprint may include metal strips extending from the main body of the cooling plate 31 for covering these remote low-power components. In some embodiments, these strips can be three dimensionally shaped in order to bridge over obstacles, such as other components, which may otherwise be in the way. The taller passive components 10 may be left exposed. As discussed above, this thereby allows the cooling plates 31 to seat closer to the circuit board 1, against the tops of the shorted high-power components 7.

In use, coolant, for example a water/glycol mixture, is pumped through inlet pipe 2, enters and fills the first enclosure 32. From here, the coolant flows through the conduits and other enclosures and out through the outlet 5. Within each enclosure 32, coolant is flooded over the surface area occupied by the enclosure 32, drawing heat from its upper surface. In automotive applications, the inlet pipe 2 and the outlet pipe 5 may be fed by the vehicle's cooling system.

With the above arrangements, each cooling plate assembly 3*a-d* provides optimized thermal contact with its respective high-power component 7. As such, the coolant is located much closer to those components than in a conventional cold plate arrangement. At the same time, each cooling plate 31 contains less material compared to conventional cold plates. A very high cooling efficiency may therefore be achieved, at the same time as reducing weight.

Figure 5A:
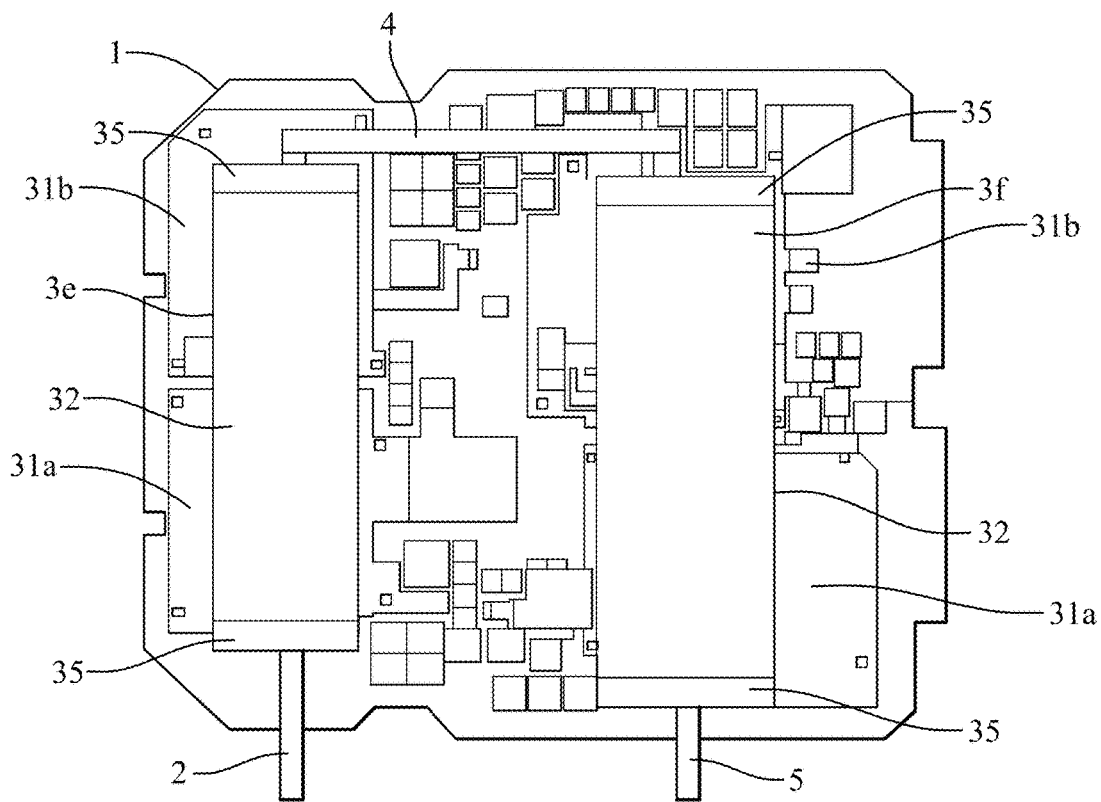
FIG. 5A shows a top view of a cooling device according to a second embodiment fitted to the circuit board shown in FIG. 3.
Figure 5B:
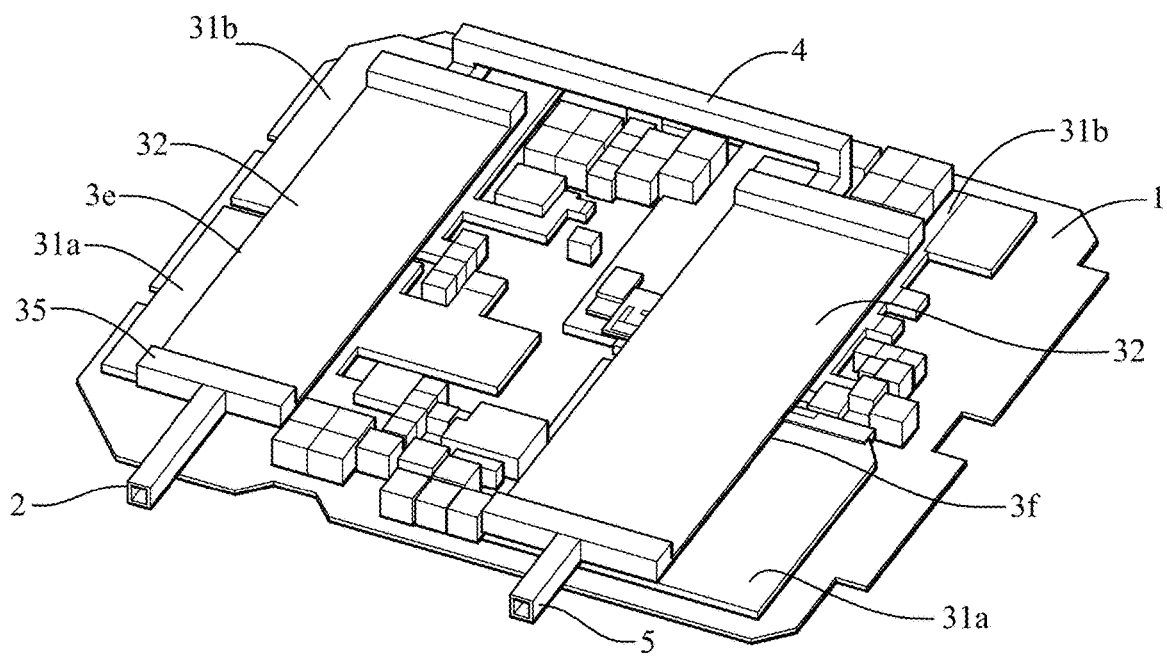
FIG. 5B shows an isometric view of the cooling device shown in FIG. 5A.

FIGS. 5A and 5B respectively show top and isometric views of a cooling device according to a second embodiment when fitted to the circuit board 1 shown in FIG. 3. This embodiment is similar to the embodiment described above, except that the enclosures 32 are provided as thin planar containers which, owing to their flexibility, may be mounted across more than one cooling plate 31.

In this connection, the embodiment shown in FIGS. 5A and 5B has two cooling plate assemblies (3*e*, 3*f*), which each comprise two cooling plates (31*a*, 31*b*). Each cooling plate (31*a*, 31*b*) is aligned with a respective high-power electronic component 7*a-d* located on the circuit board 1. The enclosures 32 are each formed from thin, flexible metallic sheet which has been shaped into a rectangular prism to form a fluid conduit with a flattened profile. As such, the contacting faces of the enclosures 32 mounted to the cooling plates (31*a*, 31*b*) present a large surface area for heat transfer. The thinness of the metallic sheet and the planar configuration of the enclosure structure also means that the enclosures 32 are sufficiently flexible that, when mounted to the adjacent cooling plates (31*a*, 31*b*), height differences between those neighboring cooling plates 31 can be tolerated. As such, height differences between components associated with those cooling plates can be compensated for, whilst avoiding the need for separate enclosures and conduits between neighboring cooling plates. This therefore reduces the number of parts and the complexity of the arrangement because the use of conduits 4 can be limited to instances where larger gaps or height differences need to be bridged.

As shown in FIGS. 5A and 5B, the enclosures 32 in this embodiment further include coolant collector regions 35 located at their ends. These sections form expanded structures for connecting the inlet 2 and outlet 5, as well as the conduit 4 bridging between the sections. The coolant collector regions 35 also form enlarged cavities within the internal fluid channel of the enclosures 32 for collecting coolant and feeding it through the fluid circuit. As with the previous embodiment, screws fixed to spacers may be used to bias the cooling plates 31 into mating contact with the components on the circuit board 1.

Figure 6:
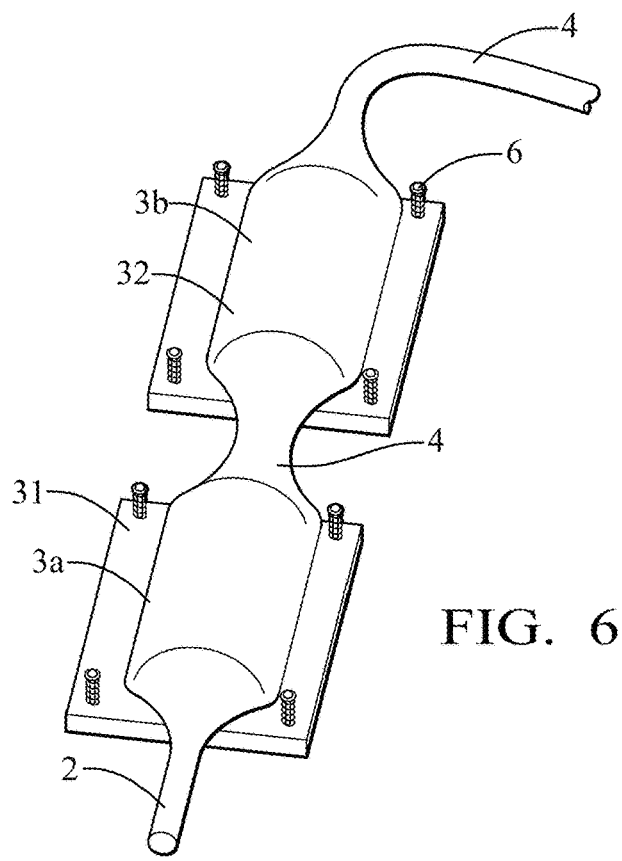
FIG. 6 shows an isometric view of part of a cooling device according to a third embodiment.
Figure 7:
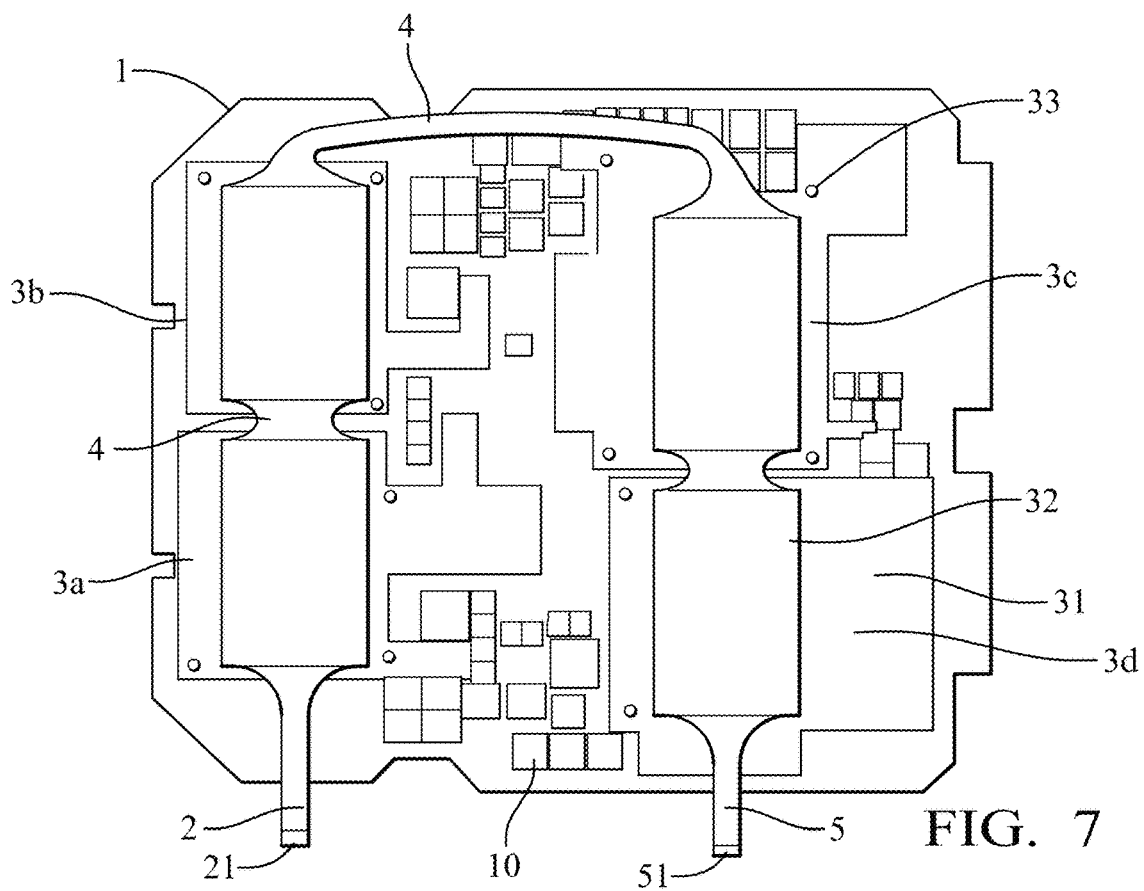
FIG. 7 shows a top view of the cooling device shown in FIG. 6 fitted to the circuit board shown in FIG. 3.

FIGS. 6 and 7 show a cooling device according to a third embodiment. This embodiment is similar to the first embodiment, except that the enclosures 32 and the conduits 4 are formed of an elastomer. In this example, the enclosures 32 and conduits 4 are formed integrally, and the enclosure parts are then mounted to their respective cooling plates 31 using an adhesive. Alternatively, the enclosure 32 might be connected to their respective cooling plates 31 using an injection molding process. Fluid connectors (21, 51) for connection to an external coolant circuit are integrated into the inlet 2 and outlet 5 sections of the elastomer material by injection molding around them.

With the above arrangement, the elastomer conduits 4 provide the flexibility needed to optimize mating between the high-power components 7 and the cooling plates 31. At the same time, the elastomer enclosure 32 provides a lightweight assembly, which is also securely sealed owing to its integral construction.

With the above arrangement, the elastomer conduits 4 provide the flexibility needed to optimize mating between the high-power components 7 and the cooling plates 31. At the same time, the elastomer enclosure 32 provides a lightweight assembly, which is also securely sealed owing to its integral construction.

It is to be understood that the embodiments illustrated above shows an application only for the purposes of illustration. In practice, embodiments may be applied to many different configurations, the detailed embodiments being straightforward for those skilled in the art to implement.

For example, it is to be understood that each cooling plate assembly may be associated with more than one high-power component, albeit that the thermal efficiency for those high-power components may be compromised by such an arrangement.

What is claimed is:

1. An apparatus comprising:
   a plurality of cooling plate assemblies, the cooling plate assemblies each comprising:
      a cooling plate for mating to at least one high-power electronic component mounted on a circuit board, the cooling plate shaped to expose one or more other electronic components mounted to the circuit board when the cooling plate is mated with the at least one high-power electronic component; and
      an enclosure mounted to the cooling plate for defining a coolant transport path over at least part of a surface thereof; and
   one or more conduits connecting between the cooling plate assemblies for fluid communication between their respective coolant transport paths, the conduits are flexible such that positions of the cooling plates are adjustable for mating to respective high-power electronic components in different planes.

2. The apparatus according to claim 1, wherein each cooling plate is configured to mate with the one or more other electronic components mounted on the circuit board.

3. The apparatus according to claim 1, wherein the one or more conduits have a maximum bend radius of less than 45 mm.

4. The apparatus according to claim 1, wherein the one or more conduits comprise at least one of:
   an elastomer tube; or
   a flexible metal tube.

5. The apparatus according to claim 1, further comprising a plurality of couplings for biasing the cooling plates toward the circuit board for mating to the high-power electronic components.

6. The apparatus according to claim 5, wherein the couplings further comprise: a fixture for connection to the circuit board; and a spring coupled to the fixture for applying a biasing force to the respective cooling plate.

7. The apparatus according to claim 1, wherein each cooling plate further comprises: a mating face for mating flat against a top surface of its respective high-power electronic component.

8. The apparatus according to claim 7, wherein the mating face comprises: component formations for mating to the top surfaces of the one or more other electronic components.

9. The apparatus according to claim 1, wherein the enclosure of each of the cooling plate assemblies comprises: a shaped sheet fixed to an upper face of the cooling plate to define a fluid cavity for forming the coolant transport path therebetween.

10. The apparatus according to claim 9, wherein the shaped sheet is formed of sheet metal.

11. The apparatus according to claim 10, wherein the sheet metal of the shaped sheet defines one or more substantially cuboidal fluid transport cavities.

12. The apparatus according to claim 9, wherein the shaped sheet is formed of an elastomer.

13. The apparatus according to claim 12, wherein the elastomer of the shaped sheet is formed integrally with the one or more conduits.

14. A method of manufacturing a cooling device for cooling a plurality of high-power electronic components mounted on a circuit board, the method comprising the steps of:
   shaping a plurality of cooling plates to each mate to one of the pluralities of a high-power electronic component mounted on a circuit boards, at least one of the plurality of cooling plates is shaped to expose one or more other electronic components mounted to the circuit board when the at least one of the plurality of cooling plates is mated with the high-power electronic component;
   mounting at least one enclosures to each of the cooling plates for forming cooling plate assemblies, wherein a coolant transport path is defined between each enclosure and at least part of a surface of its respective cooling plate; and
   connecting one or more conduits between the cooling plate assemblies for fluid communication between their respective coolant transport paths, wherein the conduits are flexible such that positions of the cooling plates are adjustable for mating to respective high-power electronic components in different planes.

15. A system comprising:
   a circuit board including at least one high-power electronic component mounted on the circuit board; and
   a cooling device for cooling the at least one high-power electronic component, the cooling device comprising:
   a plurality of cooling plate assemblies, the cooling plate assemblies each comprising:
      a cooling plate configured for mating to the at least one high-power electronic component mounted on the circuit board, the cooling plate shaped to expose one or more other electronic components mounted to the circuit board when the cooling plate is mated with the at least one high-power electronic component, the cooling plate further comprising:
         a mating face configured for mating flat against a top surface of its respective high-power electronic component; and
      an enclosure mounted to the cooling plate for defining a coolant transport path over at least part of a surface thereof;
   one or more conduits connecting between the cooling plate assemblies for fluid communication between their respective coolant transport paths, the conduits flexible such that positions of the cooling plates are adjustable for mating to respective high-power electronic components in different planes; and a plurality of couplings for biasing the cooling plates toward the circuit board for mating to the high-power electronic components.

16. The system according to claim 15, wherein at least one of the conduits comprise at least one of: an elastomer tube; or a flexible metal tube.

17. The system according to claim 15, wherein the couplings further comprise:

a fixture for connection to the circuit board; and a spring coupled to the fixture for applying a biasing force to the respective cooling plate.

18. The system according to claim 15, wherein the enclosure of each of the cooling plate assemblies comprises a shaped sheet fixed to an upper face of the cooling plate to define a fluid cavity for forming the coolant transport path therebetween.

19. The system according to claim 18, wherein at least one of:

the shaped sheet is formed of sheet metal and defines one or more substantially cuboidal fluid transport cavities; or the shaped sheet is formed of an elastomer and integrally with the one or more conduits.

* * * * *